United States Patent
Yoo et al.

(10) Patent No.: US 10,453,724 B2
(45) Date of Patent: Oct. 22, 2019

(54) APPARATUS FOR STORING AND HANDLING ARTICLE AT CEILING

(71) Applicant: DAIFUKU CO., LTD., Osaka (JP)

(72) Inventors: Dong-Gyu Yoo, Cheonan-si (KR); Jae-Yoon Kim, Cheonan-si (KR)

(73) Assignee: DAIFUKU CO., LTD., Osaka (JP)

( * ) Notice: Subject to any disclaimer, the term of this patent is extended or adjusted under 35 U.S.C. 154(b) by 0 days.

(21) Appl. No.: 15/933,450

(22) Filed: Mar. 23, 2018

(65) Prior Publication Data

US 2018/0211857 A1 Jul. 26, 2018

Related U.S. Application Data

(63) Continuation of application No. 15/071,461, filed on Mar. 16, 2016, now Pat. No. 10,141,213.

(30) Foreign Application Priority Data

Mar. 16, 2015 (KR) ........................ 10-2015-0036080

(51) Int. Cl.
*B65G 1/00* (2006.01)
*H01L 21/677* (2006.01)

(52) U.S. Cl.
CPC .. *H01L 21/67733* (2013.01); *H01L 21/67769* (2013.01); *B65G 2201/0297* (2013.01)

(58) Field of Classification Search
CPC ........... H01L 21/6773; H01L 21/67733; H01L 21/67389
USPC ................................. 414/217, 279, 626, 940
See application file for complete search history.

(56) References Cited

U.S. PATENT DOCUMENTS

| 6,506,009 | B1 | 1/2003 | Nulman et al. |
| 7,437,999 | B2 | 10/2008 | Nakao |
| 7,850,412 | B2 | 12/2010 | Benedict et al. |
| 8,554,643 | B2 | 10/2013 | Kortelainen |
| 9,048,275 | B2 | 6/2015 | Murata et al. |

(Continued)

FOREIGN PATENT DOCUMENTS

| CN | 102470982 A | 5/2012 |
| JP | 2006-282382 A | 10/2006 |

(Continued)

OTHER PUBLICATIONS

Korean Office Action Corresponding to 10-2015-0036080 dated Dec. 16, 2015.

(Continued)

*Primary Examiner* — Mark C Hageman
*Assistant Examiner* — Willie Berry, Jr.
(74) *Attorney, Agent, or Firm* — Davis & Bujold PLLC; Michael J. Bujold

(57) ABSTRACT

Disclosed herein is an apparatus for storing and handling an article at a ceiling, including: an internal rail configured to hang on the ceiling; a storage system configured to hang on the ceiling and including a shelf of a first row and a shelf of a second row disposed on both sides of the internal rail to face each other and a transport in/out port connected to any one of the shelf of the first row and the shelf of the second row; and an internal transfer robot configured to be movably connected to the internal rail and convey the article between any one of the shelf of the first row and the shelf of the second row and the transport in/out port.

14 Claims, 6 Drawing Sheets

(56) References Cited

U.S. PATENT DOCUMENTS

| | | |
|---|---|---|
| 9,701,431 B2 | 7/2017 | Tominaga |
| 2006/0180069 A1* | 8/2006 | Stolzer ..................... B63C 3/06 |
| | | 114/44 |
| 2015/0202664 A1 | 7/2015 | Murata et al. |

FOREIGN PATENT DOCUMENTS

| | | |
|---|---|---|
| JP | 2009-051600 A | 3/2009 |
| JP | 2009-173396 A | 8/2009 |
| JP | WO2012/160917 A1 | 7/2014 |
| KR | 101173120 B1 | 8/2012 |
| KR | 101434951 B1 | 8/2014 |
| TW | 201418121 A | 5/2014 |
| WO | 2014/030421 A1 | 2/2014 |

OTHER PUBLICATIONS

Chinese Office Action Corresponding to 201610150834.X dated Dec. 5, 2017.
Taiwanese Office Action Corresponding to 105107905 dated Nov. 11, 2016.

* cited by examiner

APPARATUS FOR STORING AND HANDLING ARTICLE AT CEILING

CROSS REFERENCE TO RELATED APPLICATION

This application claims the benefit of Korean Patent Application No. 10-2015-0036080, filed on Mar. 16, 2015, entitled "APPARATUS FOR STORING AND HANDLING ARTICLE AT CEILING", which is hereby incorporated by reference in its entirety into this application.

BACKGROUND OF THE INVENTION

Technical Field

The present invention relates to an apparatus for storing and handling an article at a ceiling.

Description of the Related Art

Generally, a semiconductor package is manufactured by producing a wafer in a semiconductor manufacturing process and inputting the produced wafer into the next production step.

In this case, the produced wafer is not input into just the next step but is stored for a predetermined time and then sequentially transferred to the next step as needed. Therefore, a facility for storing a waiting wafer is required. The storage facility is installed on the ground of the semiconductor factory, and therefore may take up a large space.

As a solution of the problem, a temporary storage facility for the wafer may be installed around a traveling path of a robot transferring the wafer.

However, the temporary storage facility may store only a small quantity of wafer for a while. Further, one robot for loading/unloading the wafer into/from the temporary storage facility is not free from interference with another robot driving the moving path on which the robot is driven. Further, the temporary storage facility is not easy to be expanded in response to the increase in the quantity of wafer.

SUMMARY OF THE INVENTION

The present invention has been made in an effort to provide an apparatus for storing and handling an article at a ceiling capable of independently storing and handling a large quantity of article at a ceiling.

Further, the present invention has been made in an effort to provide an apparatus for storing and handling an article at a ceiling capable of easily expanding a facility for storing and handling an article in response to an increase in an amount of article.

According to an exemplary embodiment of the present invention, there is provided an apparatus for storing and handling an article at a ceiling, including: an internal rail configured to hang on the ceiling; a storage system configured to hang on the ceiling and including a shelf of a first row and a shelf of a second row disposed on both sides of the internal rail to face each other and a transport in/out port connected to any one of the shelf of the first row and the shelf of the second row; and an internal transfer robot configured to be movably connected to the internal rail and convey the article between any one of the shelf of the first row and the shelf of the second row and the transport in/out port, wherein the internal transfer robot includes: a two-way sliding unit configured to slide a holding unit holding the article toward any one of the shelf of the first row and the shelf of the second row; and an elevation-driving unit configured to elevate the two-way sliding unit along a height direction of the shelf of the first row and the shelf of the second row.

The internal rail may include an exposed end portions which are not blocked by the shelf of the first row and the shelf of the second row along an extending direction of the internal rail.

The storage system may further include: a lower frame; a first pillar frame configured to be erected on the lower frame and provided with the shelf of the first row; and a second pillar frame configured to be erected on the lower frame to be spaced apart from the first pillar frame and provided with the shelf of the second row.

At least one of the first pillar frame and the second pillar frame may include: a floor member configured to support the shelf of the first row or the shelf of the second row; and a pair of wall members configured to be coupled with both end portions of the floor member, respectively and disposed along a direction intersecting with a plane on which the floor member is formed.

The floor member may include a plurality of floors forming a plurality of layers and the shelf of the first row or the shelf of the second row may include a plurality of shelves forming the plurality of layers corresponding to the plurality of floors.

The apparatus may further include: an external rail installed outside the storage system to pass upper portions of the transport in/out port to provide a transfer path for transferring the article to the transport in/out port to an external transfer robot.

The external rail may include: an exposed end portion extended beyond end portions of the shelf of the first row and the shelf of the second row along an extending direction of the external rail.

The apparatus may further include: a cradle installed to hang on the ceiling, wherein the internal rail, the storage system, and the external rail are connected to the cradle to hang on the ceiling.

The cradle may include a plurality of horizontal frames and vertical frames and the plurality of horizontal frames and vertical frames may form a lattice structure.

The internal transfer robot may further include a body configured to include a drive portion movably hanging on the internal rail and a base driven by the drive portion, the elevation-driving unit may include an elevation rail installed at the base, and the two-way sliding unit may be installed at the elevation-driving unit to be elevated in a height direction of the base along the elevation rail.

The apparatus may further include: a purge unit configured to supply purge gas to the article seated on the shelf of the first row and the shelf of the second row.

The purge unit may include: a gas tank configured to communicate with the article and providing the purge gas to the article; a recovering pump configured to communicate with the article to recover purge gas supplied to the article; and a controller configured to operate the recovering pump when a predetermined time elapses after the purge gas is supplied to the article.

According to another exemplary embodiment of the present invention, there is provided an apparatus for storing and handling an article at a ceiling, including: a first storage system configured to hang on the ceiling and include a shelves of two rows and a first transport in/out port connected to the shelves of the two rows; a second storage system configured to hang on the ceiling and include the shelves of the two rows and disposed to continue to the first storage system; a first internal rail configured to hang on the ceiling and disposed between the shelves of the second row of the first storage system; a second internal rail configured to hang on the ceiling, be disposed between the shelves of the second row of the second storage system, and form a transfer path along with the first internal rail; and an internal transfer robot configured to move along the transfer path to convey the article between any one of the shelves of the two rows of the first storage system and the shelves of the two rows of the second storage system and the first transport in/out port, wherein the internal transfer robot may include: a two-way sliding unit configured to slide a holding unit holding the article in two ways; and an elevation-driving unit configured to elevate the two-way sliding unit.

The first internal rail may have a length beyond a length of the first storage system and the second internal rail may have a length beyond a length of the second storage system.

Each of the shelves of the two rows of the first storage system and the shelves of the two rows of the second storage system may include shelves forming a plurality of layers.

The second storage system may further include: a second transport in/out port configured to be connected to the shelves of the two rows of the second storage system.

BRIEF DESCRIPTION OF THE DRAWINGS

The above and other objects, features and advantages of the present invention will be more clearly understood from the following detailed description taken in conjunction with the accompanying drawings, in which:

FIG. 6 is a perspective view illustrating an extended state of the apparatus 100 for storing and handling the article at the ceiling FIG. 1.

DESCRIPTION OF THE PREFERRED EMBODIMENTS

Figure 1:
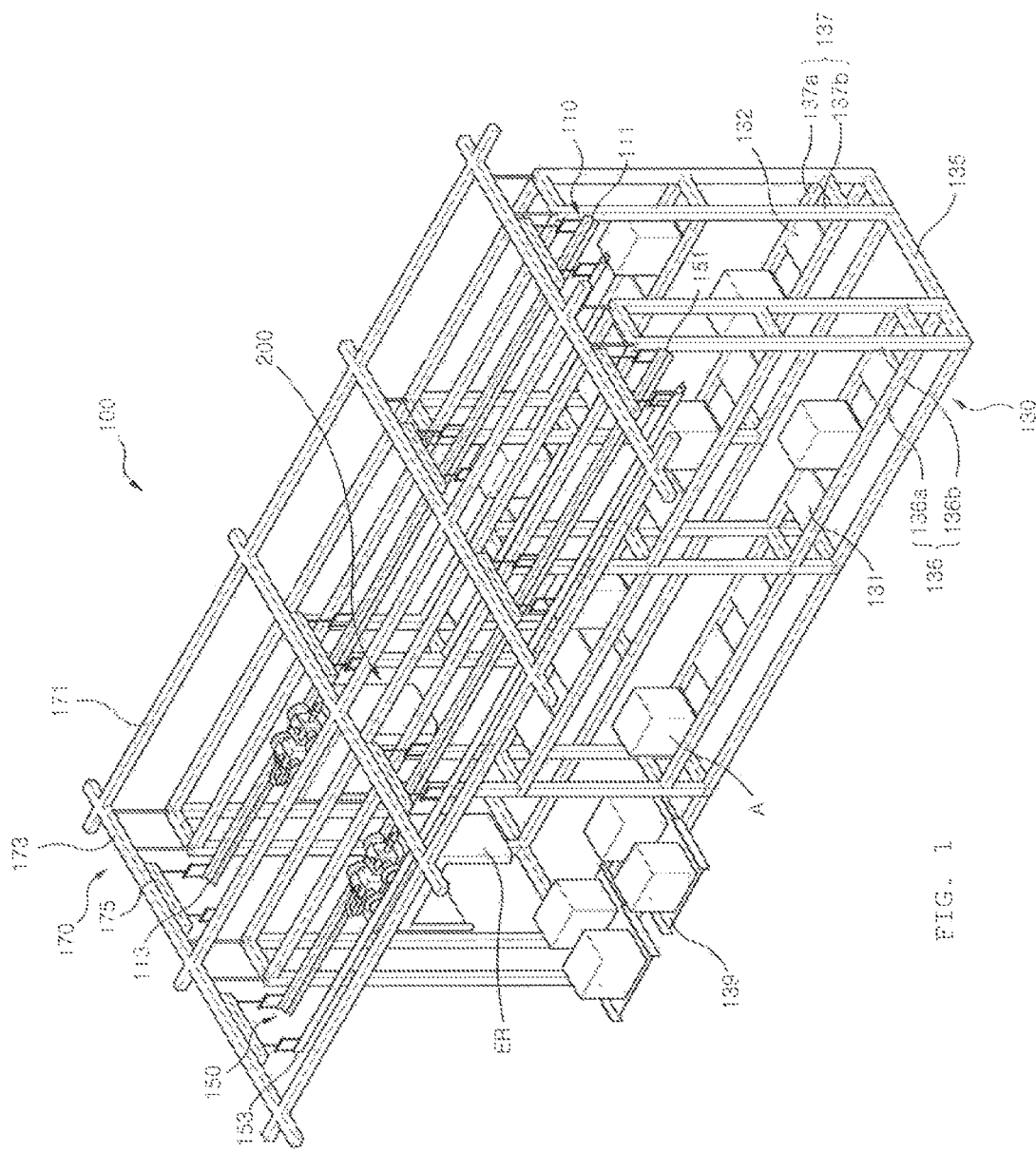
FIG. 1 is a perspective view of an apparatus 100 for storing and handling an article at a ceiling according to an exemplary embodiment of the present invention.

Hereinafter, an apparatus for storing and handling an article at a ceiling according to an exemplary embodiment of the present invention will be described in detail with reference to the accompanying drawings. In the present specification, throughout the exemplary embodiments of the present invention, same or similar components will be denoted by the same or similar reference numerals and a description thereof will be replaced by a first description.

Figure 2:
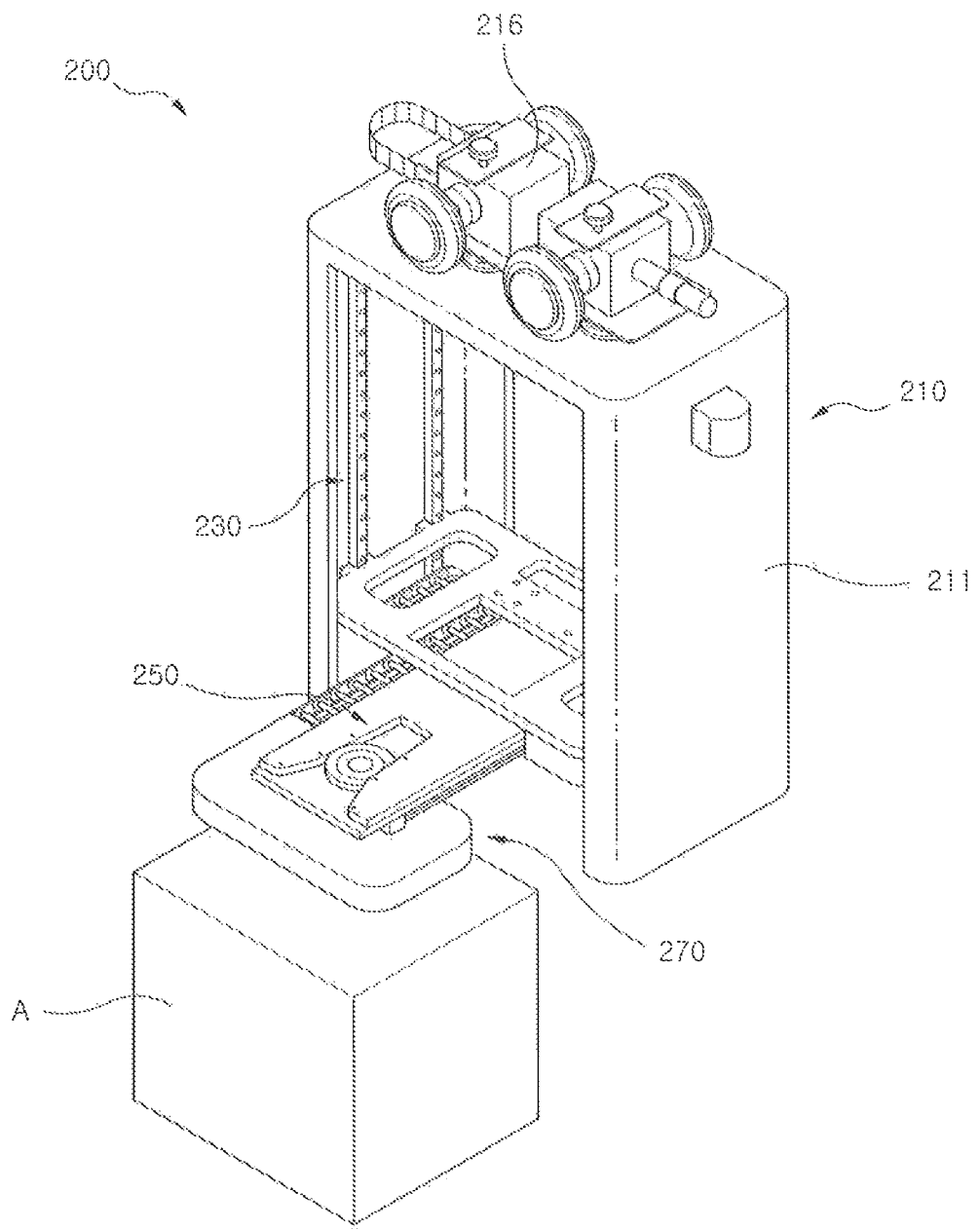
FIG. 2 is a side view of a main part of the apparatus 100 of FIG. 1.

FIG. 1 is a perspective view of an apparatus 100 for storing and handling an article at a ceiling according to an exemplary embodiment of the present invention and FIG. 2 is a side view of a main part of the apparatus 100 of FIG. 1.

Referring to FIGS. 1 and 2, the apparatus 100 for storing and handling an article at a ceiling may include an internal rail 110, a storage system 130, an external rail 150, a cradle 170, and an internal transfer robot 200.

The internal rail 110 is configured to drivably support the internal transfer robot 200. The internal rail 110 generally has a bar shape and forms a moving path (transfer path) of the internal transfer robot 200.

The internal rail 110 may have a length corresponding to a shelf 131 of a first row and a shelf 132 of a second row that will be described below. For example, both end portions 111 and 113 of the internal rail 110 are extended beyond both end portions of the shelf 131 of the first row and the shelf 132 of the second row and may be called an exposed end portion. By this configuration, the exposed end portions 111 and 113 are not blocked by the shelf 131 of the first row and the shelf 132 of the second row along an extending direction of the internal rail 110.

Further, the internal rail 110 is configured to hang on the ceiling. According to the exemplary embodiment of the present invention, the internal rail 110 is connected to the cradle 170 to be described below to hang on the ceiling.

The storage system 130 is configured to store an article A, for example, a FOUP used in a semiconductor factory. The storage system 130 is configured to hang on the ceiling. The storage system 130 may include the shelf 131 of the first row, the shelf 132 of the second row, a lower frame 135, a first pillar frame 136, a second pillar frame 137, and a transport in/out port 139.

The shelf 131 of the first row and the shelf 132 of the second row are shelves disposed at both sides of the internal rail 110 to face each other. The shelf 131 of the first row and the shelf 132 of the second row are spaced apart from each other by an interval through which the internal transfer robot 200 may pass. The shelf 131 of the first row and the shelf 132 of the second row may each be configured as a plurality of individual shelves. Each shelf may have a size corresponding to one article A.

The lower frame 135 may form a bottom portion of the storage system 130. The lower frame 135 may generally have a quadrangular shape. The lower frame 135 may be formed long along the extending direction of the internal rail 110. The lower frame 135 is a medium through which the shelf 131 of the first row and the shelf 132 of the second row are connected to each other.

The first pillar frame 136 and the second pillar frame 137 may be erected at both edges of the lower frame 135 while being spaced apart from each other. In this case, the first pillar frame 136 may be provided with the shelf 131 of the first row and the second pillar frame 137 may be provided with the shelf 132 of the second row.

The first pillar frame 136 and the second pillar frame 137 may have floor members 136a and 137a and wall members 136b and 137b.

The floor members 136a and 137a are configured to support the shelf 131 of the first row and the shelf 132 of the second row. The floor members 136a and 137a may be extended along the extending direction of the internal rail 110. The floor members 136a and 137a may be provided as a plurality of individual floors disposed to form a plurality of layers. The shelf 131 of the first row or the shelf 132 of the second row may also have the individual shelves forming a plurality of layers corresponding to the floor members 136a and 137a of the plurality of layers.

The wall members 136b and 137b are coupled to both end portions of the floor members 136a and 137a, respectively, and formed in pair, thereby firmly supporting the floor members 136a and 137a. The wall members 136b and 137b are disposed along a direction intersecting with a plane on which the floor members 136a and 137a are formed.

The transport in/out port 139 protrudes at a portion of the shelf 131 of the first row to be disposed at a lower portion of the external rail 150. An article A to be put on the shelf 131 of the first row or the shelf 132 of the second row or the article A taken out therefrom is temporarily put on the transport in/out port 139.

The external rail 150 is installed outside the storage system 130 and is disposed to pass through an upper portion of the transport in/out port 139. The external rail 150 may generally be installed in parallel with the internal rail 110 in an area corresponding to the storage system 130. The external rail 150 may be movably provided with an external transfer robot ER that is operated in connection with the internal transfer robot 200. The external rail 150 may have exposed end portions 151 and 153 extended beyond the end portion of the shelf 131 of the first row or the shelf 132 of the second row along the extending direction of the external rail 150.

The cradle 170 is configured to hang on the ceiling. The cradle 170 may be connected to the internal rail 110, the storage system 130, and the external rail 150.

The cradle 170 may have a horizontal frame 171 and a vertical frame 173. The horizontal frame 171 and the vertical frame 173 may be disposed in a direction intersecting with each other to form a lattice structure. Further, the cradle 170 may further include a medium frame 175 coupled with the vertical frame 173. The medium frame 175 is an object to which the internal rail 110 is connected and prevents vibrations due to the driving of the internal transfer robot 200 from being directly transferred to the storage system 130 through the vertical frame 173, etc.

By this configuration, the cradle 170 is connected to the ceiling by a connection rod (not illustrated), etc. In this state, the cradle 170 may be connected to the internal rail 110, the storage system 130, and the external rail 150. The internal rail 110 may be drivably provided with the internal transfer robot 200 and the external rail 150 may be drivably provided with the external transfer robot ER. The internal transfer robot 200 is moved between the first pillar frame 136 and the second pillar frame 137.

The article A is conveyed by the external transfer robot ER and is put down to the transport in/out port 139. The internal transfer robot 200 picks up the article A and puts down the article A to any one of the shelf 131 of the first row or the shelf 132 of the second row. By this, the article A is stored in the storage system 130 and may suffer from purge handling.

On the contrary, the article A in the storage system 130 is carried on the internal transfer robot 200 to be moved toward the transport in/out port 139 and is then put down to the transport in/out port 139. In this process, the internal transfer robot 200 may be moved along the internal rail 110. The article A put on the transport in/out port 139 may be picked up by the external transfer robot ER to be conveyed to other locations. By this, the article A deviates from the storage system 130.

The internal transfer robot 200 may perform work corresponding to the shelf 131 of the first row and the shelf 132 of the second row that face each other. In detail, the internal transfer robot 200 may put down the article A to both of the shelf 131 of the first row and the shelf 132 of the second row or pick up the article A from both of the shelf 131 of the first row and the shelf 132 of the second row.

By including the internal transfer robot 230, the storage system 130 may be formed in an integrated type in which the shelf 131 of the first row and the shelf 132 of the second row are each disposed at both sides of one internal rail 110.

Further, the shelf 131 of the first row and the shelf 132 of the second row may each be formed in the plurality of layers and therefore more articles A may be integrated and stored.

Further, the storage and handling system for an article A is formed by including the internal rail 110, the internal transfer robot 200 driving along the internal rail, and the transport in/out port 139. The system may be independently operated from the external transfer robot ER that is driven along the external rail 150.

The internal transfer robot 200 will be described with reference to FIGS. 3 and 4.

Figure 3:
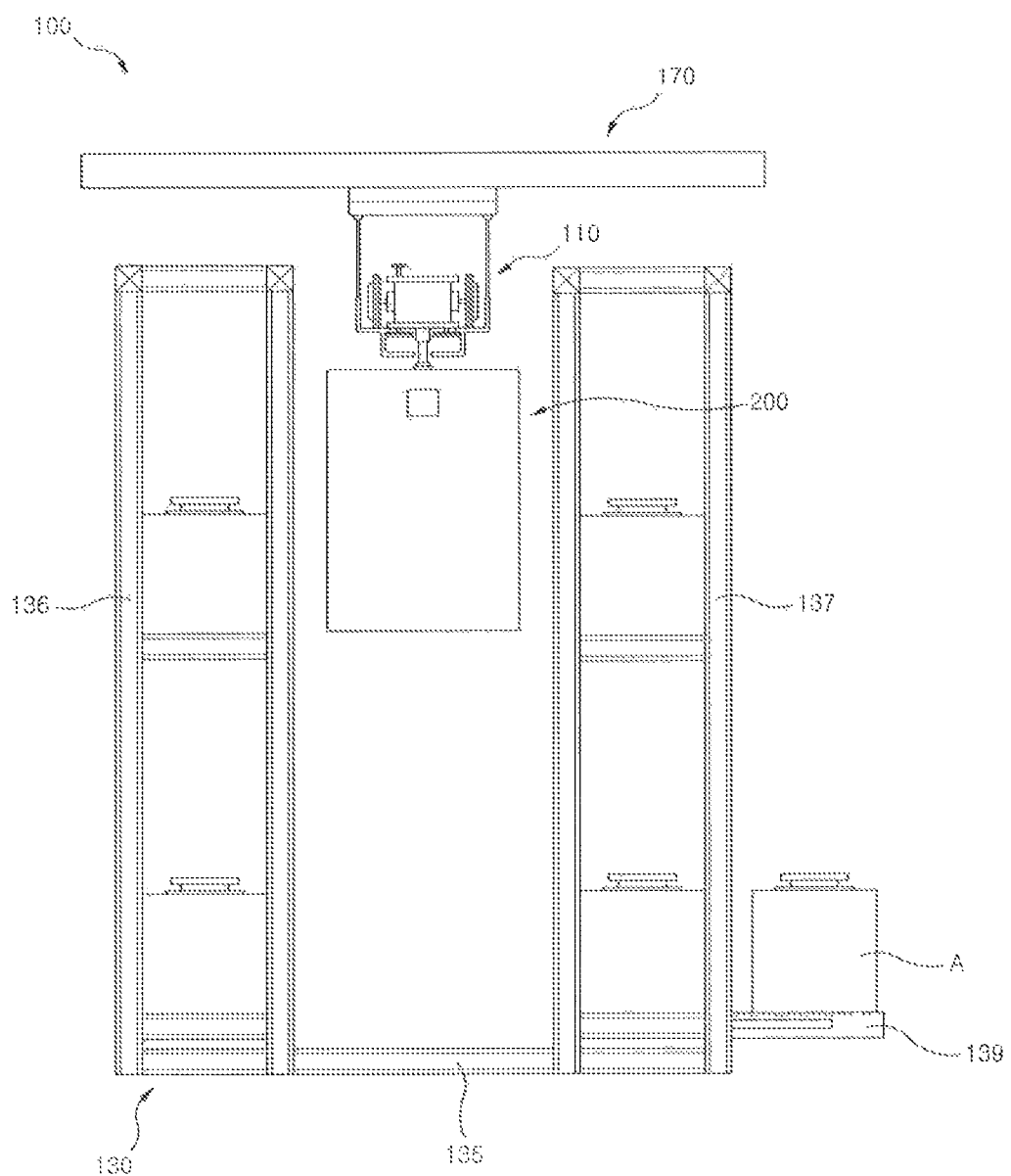
FIG. 3 is a perspective view of an internal transfer robot 200 of FIG. 1.
Figure 4:
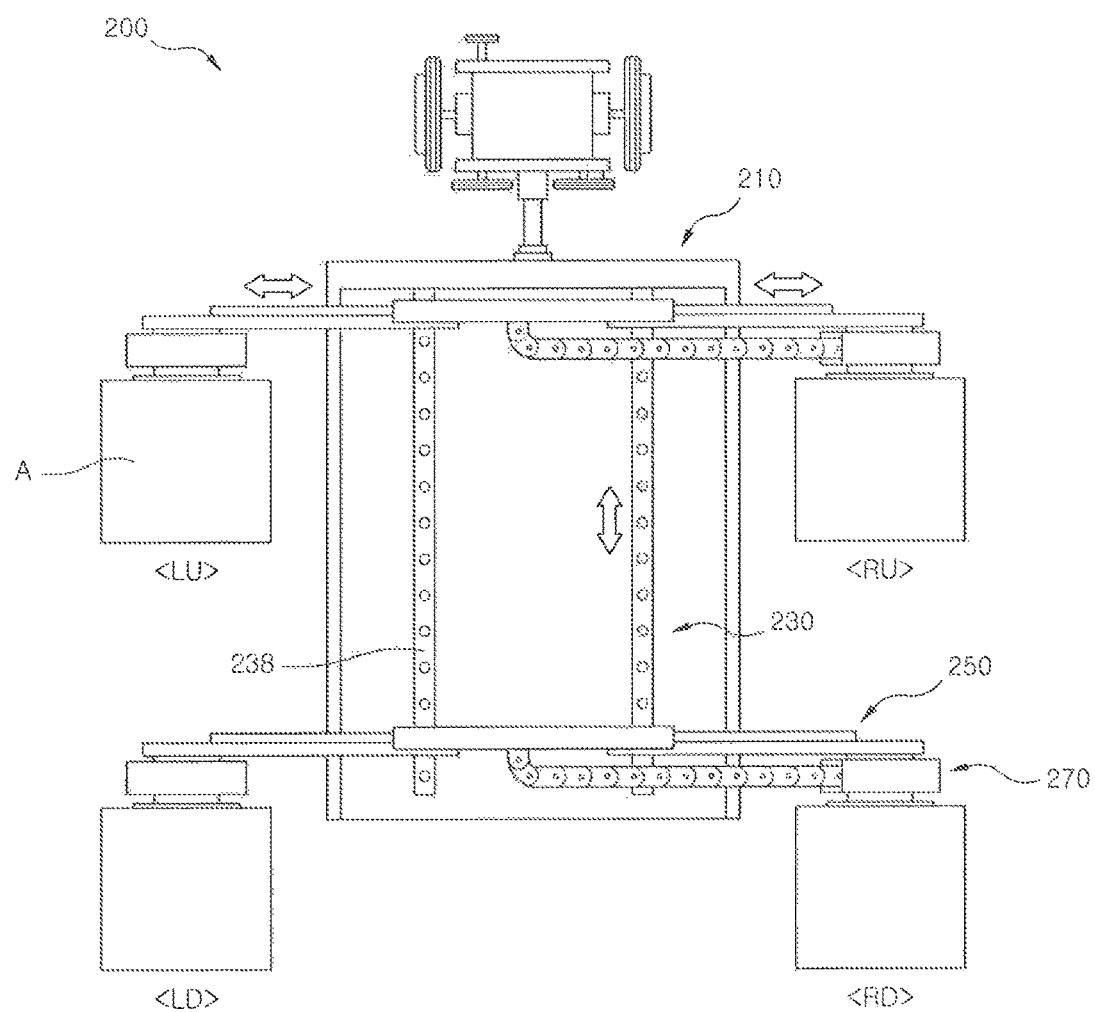
FIG. 4 is a conceptual diagram for describing an operation of the internal transfer robot 200 of FIG. 3.

FIG. 3 is a perspective view of an internal transfer robot 200 of FIG. 1 and FIG. 4 is a conceptual diagram for describing an operation of the internal transfer robot 200 of FIG. 3.

Referring to FIGS. 3 and 4, the internal transfer robot 200 may include a body 210, an elevation-driving unit 230, a two-way sliding unit 250, and a holding unit 270.

The body 210 may have a base part 211 and a drive portion 216. The base part 211 is a part provided with the elevation-driving unit 230, etc. The drive portion 216 is a part that is installed at the base part 211 and hangs on the internal rail 110 (FIG. 1). The drive portion 216 has a wheel rolling on the internal rail 110.

The elevation-driving unit 230 is configured to elevate the two-way sliding unit 250 along the height direction of the base part 211, or the shelf 131 of the first row and the shelf 132 of the second row (see FIG. 1). For this purpose, the elevation-driving unit 230 may include a motor and a belt linked to the rotation of the motor. The two-way sliding unit 250 may be connected to the belt and elevated while being supported to the sliding rail 238.

The two-way sliding unit 250 is configured to be installed at the elevation-driving unit 230 and slid in both directions based on the base part 211. For the sliding of the two-way sliding unit 250, the two-way sliding unit 250 may be configured of a plurality of plates. In this case, the sliding direction of the plurality of plates may be toward any one of the shelf 131 of the first row and the shelf 132 of the second row.

The holding unit 270 is configured to be connected to a free end of the two-way sliding unit 250 and hold the article A.

By this configuration, the drive portion 216 of the body 210 is driven along the internal rail 110 while being supported to the internal rail 110. By this, the base part 211 may be moved from one end of the storage system 130 (FIG. 1) to the other end along the internal rail 110.

When the base part 211 arrives at a set position for any one of the shelf 131 of the first row and the shelf 132 of the second row, the two-way sliding unit 250 slides the holding unit 270 toward the set article A.

In this case, when the article A is positioned to be higher or lower than the holding unit 270, the height of the two-way sliding unit 250 may be changed by the operation of the elevation driving unit 230.

When the two-way sliding unit 250 is positioned at a height corresponding to the article A, the holding unit 270 is put on the article A while the two-way sliding unit 250 is slid. Next, the holding unit 270 may be operated to hold the article A.

As a result, the holding unit 270 may hold or put down the article A at four locations such as a left upper (LU) position, a left lower (LD) position, a right upper (RU) position, and a right lower (RD) position.

On the contrary, when the article A put on the shelf 131 of the first row or the shelf 132 of the second row is taken out to the outside of the storage system 130, the internal transfer robot 200 is operated to the contrary to one described above.

Next, the purge of the article A put on the shelf 131 of the first row and the shelf 132 of the second row will be described with reference to FIG. 5.

Figure 5:
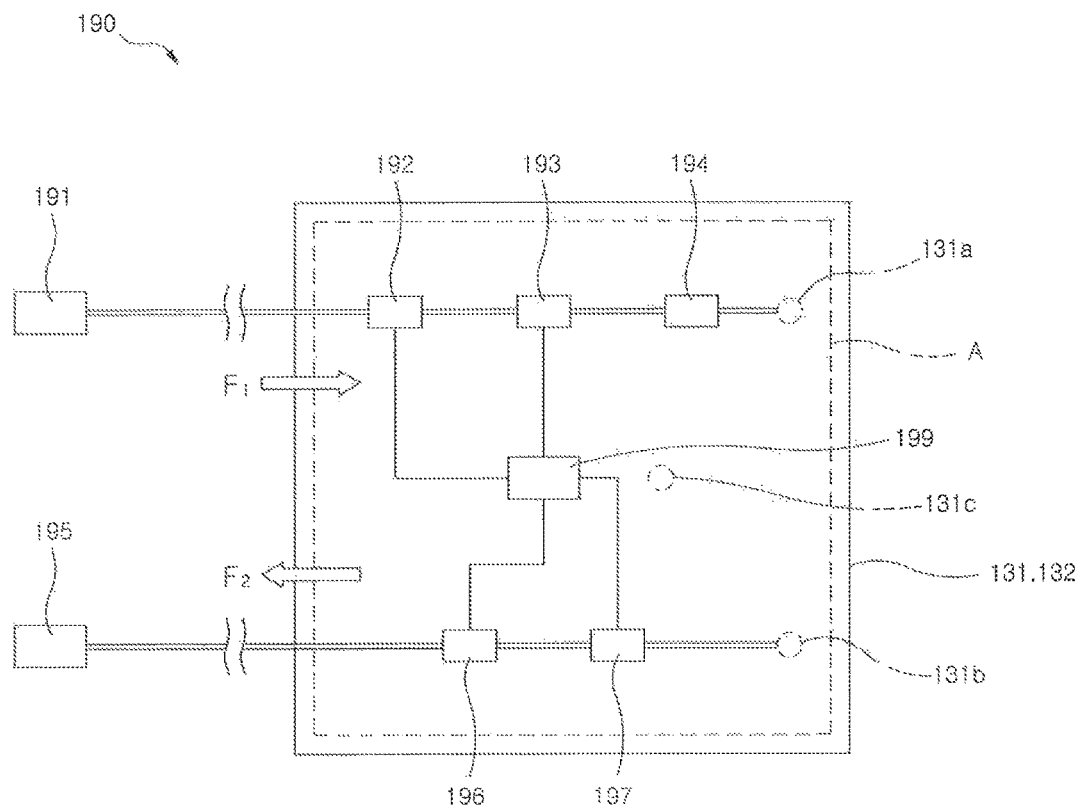
FIG. 5 is a block diagram for describing a purge unit 190 purging an article A put on shelves 131 and 132 of FIG. 1.
Figure 9:
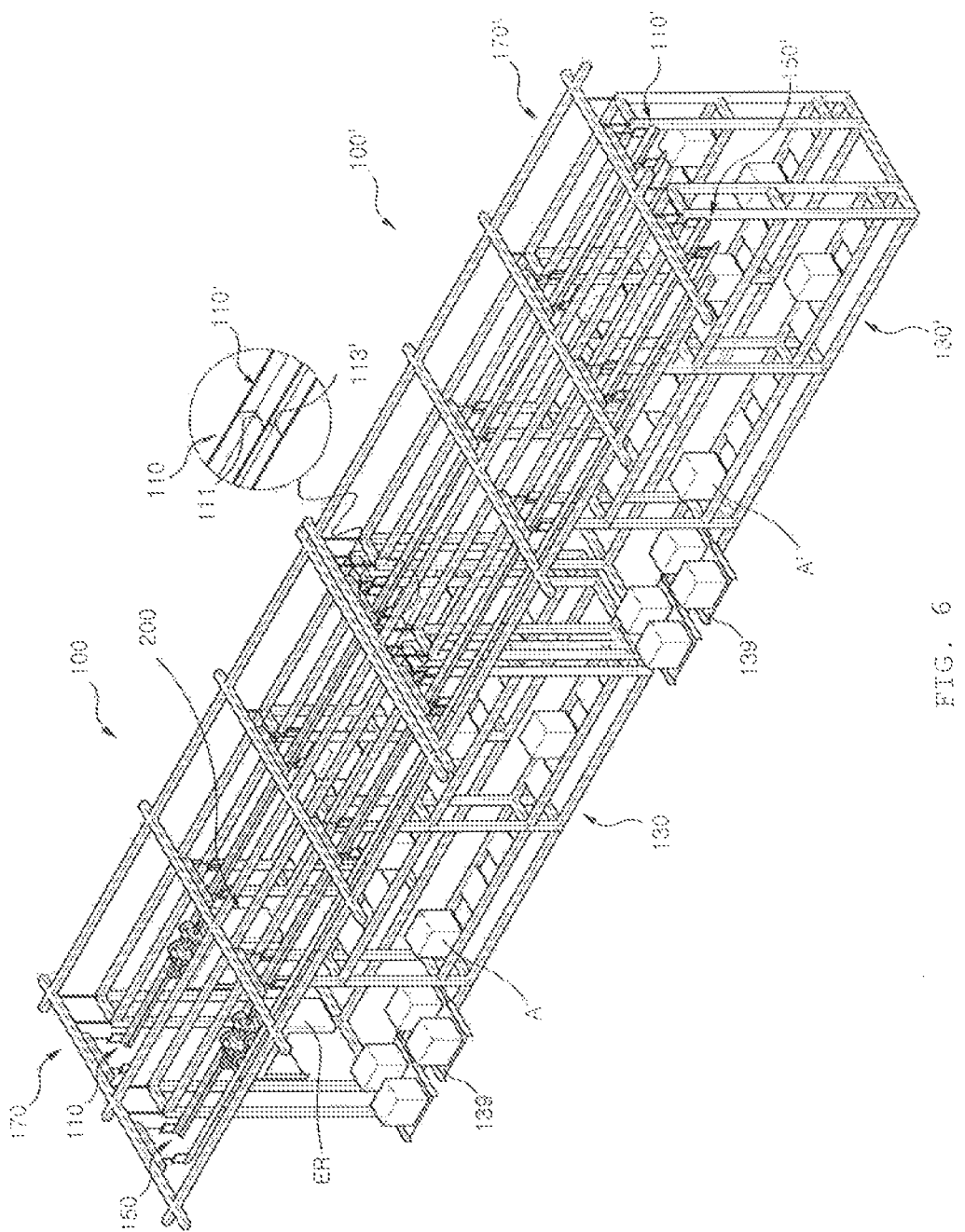

FIG. 5 is a block diagram for describing a purge unit 190 for purging an article A put on the shelves 131 and 132 of FIG. 1.

First, a supply nozzle 131*a*, an exhaust nozzle 131*b*, and a carrier sensing sensor 131*c* may be installed at the shelves 131 and 132 (hereinafter, only 131 is described). The supply nozzle 131*a* and the exhaust nozzle 131*b* are installed at an upper surface of the shelf 131 and communicate with an inside of the article A. A carrier sensing sensor 131*c* is installed at the upper surface of the shelf 131 to figure out whether the article A is positioned at the shelf 131.

For the purge of the article A, the purge unit 190 may be further provided. The purge unit 190 may have a gas tank 191, a recovering pump 195, and a controller 199.

The gas tank 191 communicates with the article A to provide purge gas into the article A. In more detail, the purge gas may pass through a supply valve 192, a supply flowmeter 193, and a gas filter 194 while flowing from the gas tank 191 to the supply nozzle 131*a*.

The supply valve 192 is configured to open and close a channel for the supply flow of purge gas. The supply valve 192 is an electrical valve and configured to perform the opening and closing operation depending on the electrical signal. The supply flowmeter 193 is disposed between the supply valve 192 and the supply nozzle 131*a* to adjust a flux of gas toward the supply nozzle 131*a* as set. The gas filter 194 is installed between the supply flowmeter 193 and the supply nozzle 131*a* to filter foreign matters in the gas supplied into the article A through the supply nozzle 131*a*. Here, the supply valve 192 and the supply flowmeter 193 may be integrated in a digital mass flow controller. In this case, the digital mass flow controller may set a supply amount of gas over time and may be electronically controlled by a computer.

The recovering pump 195 communicates with the article A to forcibly recovery the purge gas supplied to the article A. In detail, the purge gas may pass through an exhaust valve 196 and an exhaust flowmeter 197 while flowing from the recovering nozzle 131*b* to the recovering pump 195.

The recovering valve 196 is configured to open and close a channel for the exhaust flow of purge gas. The recovering valve 196 is an electrical valve and configured to perform the opening and closing operation depending on the electrical signal. The recovering flowmeter 197 is disposed between the recovering valve 196 and the recovering nozzle 131*b* to adjust the flux of gas recovered to the outside of the article A through the recovering nozzle 131*b* as set.

The controller 199 controls the opening and closing of the gas tank 191 and the operation of the recovering pump 195. The controller 199 may receive various information from the supply flowmeter 193, the recovering flowmeter 197, and the carrier sensing sensor 131*c* to control the operation of the supply valve 192 and the recovering valve 196.

For example, the controller 199 may control the opening and closing of the supply valve 192 and the recovering valve 196 based on the difference between the supplied flux measured by the supply flowmeter 193 and the recovered flux measured by the recovering flowmeter 197. In detail, when the recovered flux is subtracted from the supplied flux, the amount of gas charged in the article A is calculated. If the charged amount of gas is under the criterion, the recovering valve 196 may be closed while the supply valve 192 is in an open state. On the contrary, if the charged amount of gas exceeds the criterion, the recovering valve 196 may be open while the supply valve 192 is in a closed state.

As described above, the opening of the recovering valve 196 and the operation of the recovering pump 196 by the controller 199 are performed after the set time lapses after the supply valve 192 is open. This enables the active recovering for the purge gas. By doing so, oxidation of a wafer due to the purge gas continuously remaining within the article A or air pollution of a workspace due to a leakage of purge gas may be reduced while the article A is purged by the purge gas.

Further, the controller 199 may control the opening and closing of the supply valve 192 and/or the recovering valve 196 based on the sensing result of the carrier sensing sensor 131*c*. In detail, when the carrier sensing sensor 131*c* senses that the article A is present on the shelf 131, the supply valve 192 may be open. The controller 199 may control the recovering valve 196 to be open if a predetermined amount of gas is charged within the article A after a predetermined time lapses after the opening of the supply valve 192 is controlled.

Next, the extension system for the apparatus 100 for storing and handing an article at a ceiling will be described with reference to FIG. 6.

FIG. 6 is a perspective view illustrating an extended state of the apparatus 100 for storing and handling the article at the ceiling of FIG. 1.

Referring to FIG. 1, the extension system is a form in which an additional apparatus 100' for storing and handling an article is combined with the apparatus 100 for storing and handling an article as described above. The additional apparatus 100' for storing and handling an article is different from the apparatus 100 for storing and handling an article in that it does not have the internal transfer robot 200.

In the apparatus 100 for storing and handling an article, the internal rail 110, the storage system 130, the external rail 150, and the cradle 170 each may be called the first internal rail 110, the first storage system 130, the first external rail 150, and the first cradle 170, to be differentiated from the additional apparatus 100' for storing and handling an article.

In response, the additional apparatus 100' for storing and handling an article may have a second internal rail 110', a second storage system 130', a second external rail 150', and a second cradle 170'. They are substantially the same as the corresponding components of the apparatus 100 for storing and handling an article.

In the extension system, the second cradle 170' and the second storage system 130' may each be disposed in succession to the first cradle 170 and the first storage system 130. Further, the second internal rail 110' and the second external rail 150' are each connected to the first internal rail 110 and the first external rail 150 to form the transfer path for moving the internal transfer robot 200 and the external transfer robot ER, respectively.

Here, the exposed end portion 111 of the first internal rail 110 directly contacts the exposed end portion 113' of the second internal rail 110'. The exposed end portion of the first external rail 150 and the exposed end portion of the second external rail 150' also directly contact each other. This may be possible since the storage systems 130 and 130' do not block the end portions of the internal rails 110 and 110' and the external rails 150 and 150'. In connection with this, the first internal rail 110 may have a length beyond the length of the first storage system 130 and the second internal rail 110' may have a length beyond the length of the second storage system 130'.

The first storage system 130 has the first transport in/out port 139 and therefore the second storage system 130' may not have the transport in/out port. However, according to the present exemplary embodiment, the second storage system 130' also has a second transport in/out port 139'. This may increase efficiency of a transfer rate, etc. in transferring articles WC and WC' by the internal transfer robot 200.

By the configuration, the amount of article A is increased, and as a result if the apparatus 100 for storing and handling an article may not store and handle an article, the additional apparatus 100' for storing and handling an article may be installed at a ceiling to cope with an added article A'.

In this case, the first internal rail 110 is connected to the second internal rail 110' and therefore the internal transfer robot 200 may be driven along the transfer path formed by the internal rails 110 and 110'. By doing so, it is possible to cope with the article A and the additional article A' by using one internal transfer robot 200.

If even the second storage system 130' includes the second transport in/out port 139', the internal transfer robot 200 positioned in the first storage system 130 may move to the second storage system 130' in a no-load state to hold the article A' in the second transport in/out port 139'. Next, the internal transfer robot 200 may directly put down the article A' on the shelf of the second storage system 130'.

According to the exemplary embodiment of the present invention, the apparatus for storing and handling an article at a ceiling configured as described above may independently store and handle the large quantity of article at the ceiling to improve the space utility and the article handling ability.

Further, it is possible to easily extend the storage and handling facility in response to the increase in the quantity of article.

The apparatus for storing and handling an article at a ceiling as described above is not limited to the configuration and the operation method of the exemplary embodiments as described above. The above-mentioned exemplary embodiments may also be variously modified through a selective combination of all or some thereof.

What is claimed is:

1. An apparatus for storing and handling an article adjacent a ceiling, the apparatus comprising:
    an internal rail configured to hang from the ceiling;
    a storage system configured to hang from the ceiling and including a shelf of a first row and a shelf of a second row disposed on both sides of the internal rail to face each other and a transport in/out port connected to any one of the shelf of the first row and the shelf of the second row;
    an internal transfer robot configured to be movably connected to the internal rail and convey the article between any one of the shelf of the first row and the shelf of the second row and the transport in/out port;
    an external rail installed outside the storage system to pass upper portions of the transport in/out port to provide a transfer path for transferring the article to the transport in/out port to an external transfer robot; and
    a cradle installed to hang from the ceiling,
    wherein the internal transfer robot includes:
        a two-way sliding unit configured to slide a holding unit holding the article toward any one of the shelf of the first row and the shelf of the second row; and
        an elevation-driving unit configured to elevate the two-way sliding unit along a height direction of the shelf of the first row and the shelf of the second row, and
    the internal rail, the storage system, and the external rail are connected to the cradle to hang from the ceiling, wherein the internal rail includes exposed end portions which are not blocked by the shelf of the first row and the shelf of the second row along an extending direction of the internal rail.

2. The apparatus of claim 1, wherein the storage system further includes:
    a lower frame;
    a first pillar frame configured to be erected on the lower frame and provided with the shelf of the first row; and
    a second pillar frame configured to be erected on the lower frame and spaced apart from the first pillar frame and provided with the shelf of the second row.

3. The apparatus of claim 2, wherein at least one of the first pillar frame and the second pillar frame includes:
    a floor member configured to support the shelf of the first row or the shelf of the second row; and
    a pair of wall members configured to be coupled with both end portions of the floor member, respectively, and disposed along a direction intersecting with a plane on which the floor member is formed.

4. The apparatus of claim 3, wherein the floor member includes a plurality of floors forming a plurality of layers, and
    the shelf of the first row or the shelf of the second row includes a plurality of shelves forming a plurality of layers corresponding to the plurality of floors.

5. The apparatus of claim 1, wherein the external rail includes: an exposed end portion extended beyond end portions of the shelf of the first row and the shelf of the second row along an extending direction of the external rail.

6. The apparatus of claim 1, further comprising: a purge unit configured to supply purge gas to the article seated on the shelf of the first row and the shelf of the second row.

7. The apparatus of claim 6, wherein the purge unit includes:
    a gas tank configured to communicate with the article and provide the purge gas to the article;
    a recovering pump configured to communicate with the article and recover the purge gas supplied to the article; and
    a controller configured to operate the recovering pump when a predetermined time elapses after the purge gas is supplied to the article.

8. An apparatus for storing and handling an article adjacent a ceiling, the apparatus comprising:
    a first storage system configured to hang from the ceiling and including shelves of two rows and a first transport in/out port connected to the shelves of the two rows;
    a second storage system configured to hang from the ceiling and including shelves of two rows and the second storage system is disposed to continue to the first storage system;
    a first internal rail configured to hang from the ceiling and disposed between the shelves of the two rows of the first storage system;
    a second internal rail configured to hang from the ceiling, be disposed between the shelves of the two rows of the second storage system, and form a first transfer path along with the first internal rail;
    an internal transfer robot configured to move along the first transfer path to convey the article between any one of the shelves of the two rows of the first storage system and the shelves of the two rows of the second storage system and the first transport in/out port;
a first external rail installed outside the first storage system to pass upper portions of the transport in/out port to provide a second transfer path for transferring the article to the transport in/out port to an external transfer robot;
a second external rail installed outside the second storage system to form the second transfer path along with the first external rail;
a first cradle installed to hang from the ceiling and disposed at upper side of the first storage system; and
a second cradle installed to hang from the ceiling and disposed at upper side of the second storage system,
wherein the internal transfer robot includes:
a two-way sliding unit configured to slide a holding unit holding the article in two ways;
an elevation-driving unit configured to elevate the two-way sliding unit; and
the first internal rail, the first storage system, and the first external rail are connected to the first cradle to hang from the ceiling, and the second internal rail, the second storage system, and the second external rail are connected to the second cradle to hang from the ceiling.

9. The apparatus of claim 8, wherein the first internal rail has a length which extends beyond a length of the first storage system, and the second internal rail has a length which extends beyond a length of the second storage system.

10. The apparatus of claim 8, wherein each of the shelves of the two rows of the first storage system and the shelves of the two rows of the second storage system include shelves forming a plurality of layers.

11. The apparatus of claim 8, wherein the second storage system further includes: a second transport in/out port configured to be connected to the shelves of the two rows of the second storage system.

12. An apparatus for storing and handling an article adjacent a ceiling, the apparatus comprising:
an internal rail configured to hang from the ceiling;
a storage system configured to hang from the ceiling and including a shelf of a first row and a shelf of a second row disposed on both sides of the internal rail to face each other and a transport in/out port connected to any one of the shelf of the first row and the shelf of the second row;
an internal transfer robot configured to be movably connected to the internal rail and convey the article between any one of the shelf of the first row and the shelf of the second row and the transport in/out port;
an external rail installed outside the storage system to pass upper portions of the transport in/out port to provide a transfer path for transferring the article to the transport in/out port to an external transfer robot; and
a cradle installed to hang from the ceiling,
wherein the internal transfer robot includes:
a two-way sliding unit configured to slide a holding unit holding the article toward any one of the shelf of the first row and the shelf of the second row; and
an elevation-driving unit configured to elevate the two-way sliding unit along a height direction of the shelf of the first row and the shelf of the second row, and
the internal rail, the storage system, and the external rail are connected to the cradle to hang from the ceiling,
wherein the storage system further includes:
a lower frame;
a first pillar frame configured to be erected on the lower frame and provided with the shelf of the first row; and
a second pillar frame configured to be erected on the lower frame and spaced apart from the first pillar frame and provided with the shelf of the second row,
wherein at least one of the first pillar frame and the second pillar frame includes:
a floor member configured to support the shelf of the first row or the shelf of the second row; and
a pair of wall members configured to be coupled with both end portions of the floor member, respectively, and disposed along a direction intersecting with a plane on which the floor member is formed.

13. The apparatus of claim 12, wherein the floor member includes:
a plurality of floors forming a plurality of layers, and
the shelf of the first row or the shelf of the second row includes a plurality of shelves forming a plurality of layers corresponding to the plurality of floors.

14. The apparatus of claim 12, wherein the external rail includes: an exposed end portion extended beyond end portions of the shelf of the first row and the shelf of the second row along an extending direction of the external rail.

* * * * *